US 6,724,062 B2

(12) United States Patent
Akahori et al.

(10) Patent No.: US 6,724,062 B2
(45) Date of Patent: Apr. 20, 2004

(54) SEMICONDUCTOR ENERGY DETECTOR

(75) Inventors: Hiroshi Akahori, Hamamatsu (JP);
Hisanori Suzuki, Hamamatsu (JP);
Kazuhisa Miyaguchi, Hamamatsu (JP);
Masaharu Muramatsu, Hamamatsu (JP);
Koei Yamamoto, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 09/886,110

(22) Filed: Jun. 22, 2001

(65) Prior Publication Data

US 2001/0045577 A1 Nov. 29, 2001

Related U.S. Application Data

(63) Continuation-in-part of application No. PCT/JP99/06754, filed on Dec. 2, 1999.

(30) Foreign Application Priority Data

Dec. 28, 1998 (JP) .......................................... P10-373626

(51) Int. Cl.⁷ .............................. H01L 31/00; H04N 3/14
(52) U.S. Cl. ...................... 257/448; 257/457; 257/459; 257/460; 348/324
(58) Field of Search .......................... 348/324; 257/228, 257/21, 53, 290, 81, 118, 184, 225, 232, 457, 459, 447, 448, 460

(56) References Cited

U.S. PATENT DOCUMENTS

| | | | | |
|---|---|---|---|---|
| 4,168,444 A | * | 9/1979 | van Santen | 257/222 |
| 4,270,144 A | * | 5/1981 | Hartman et al. | 257/214 |
| 5,912,482 A | * | 6/1999 | Morimoto | 257/232 |
| 6,013,925 A | * | 1/2000 | Ogawa | 257/232 |
| 6,097,433 A | * | 8/2000 | Kawai et al. | 257/229 |
| 6,441,853 B1 | * | 8/2002 | Furumiya | 438/311 |

FOREIGN PATENT DOCUMENTS

| JP | 63-46763 | | 2/1988 | |
|---|---|---|---|---|
| JP | 01098258 A | * | 4/1989 | .......... H01L/27/14 |
| JP | 6-29506 | | 2/1994 | |
| JP | 6-77461 | | 3/1994 | |
| JP | 7-245386 | | 9/1995 | |

* cited by examiner

Primary Examiner—Tom Thomas
Assistant Examiner—Paul E Brock, II
(74) Attorney, Agent, or Firm—Morgan, Lewis & Bockius LLP

(57) ABSTRACT

A semiconductor energy detector as disclosed herein is arranged so that an aluminum wiring pattern is formed on the front side of transfer electrodes of a CCD vertical shift register, which pattern includes meander-shaped auxiliary wirings for performing auxiliary application/supplement and additional wirings for performing auxiliary supplement of transfer voltages in a way independent of the auxiliary wirings with respective ones of such wirings being connected to corresponding transfer electrodes to thereby avoid a problem as to lead resistivities at those transfer electrodes made of polycrystalline silicon, thus achieving the intended charge transfer at high speeds with high efficiency.

7 Claims, 7 Drawing Sheets

SEMICONDUCTOR ENERGY DETECTOR

RELATED APPLICATION

This is a continuation-in-part application of application Ser. No. PCT/JP99/06754 filed on Dec. 2, 1999, now pending.

BACKGROUND OF THE INVENTION

1. Field of the Invention

The present invention relates to semiconductor energy detectors using a charge coupled device (CCD).

2. Related Background Art

Charge coupled devices (CCDs) for use as image sensing devices or the like are the ones that transfer a group of analog electrical charge carriers in a single direction in away synchronous with clockpulses, which devices are capable of converting space information into time-sequence signals. Note here that mere transfer of charge carriers upon simultaneous illumination onto a CCD can lead to what is called the "smear" due to mixture of charge carriers optically excited or pumped at respective portions with the charges thus transferred, which in turn results in degradation of image signals. To avoid this, it is generally used to operate with time-division into a charge integration period for performing sensing or pickup of an image (energy ray image detection) and a charge transfer period for performing transfer of optically excited carriers. Practically implementable image pickup devices include frame transfer type (FT type), full-frame transfer type (FFT type), and interline transfer type (IT type) and others, by way of example. Of these ones, FFT type CCDs are mainly used for measurement purposes. The FFT type CCDs are adaptable for use in measuring light of low intensities because of the fact that these have no storage area and are capable of enlarging photosensitive areas to thereby permit the optical use-efficiency to stay higher.

In some cases, as semiconductor energy detectors such as CCDs used for wafer and/or photomask (reticle) inspection or else in the technical field of semiconductor manufacturing architectures, those with high sensitivities for ultraviolet rays (e.g., high-pressure mercury arc lamp "g"-line with a wavelength of 436 nm, high-pressure mercury arc lamp "i"-line of 365-nm wavelength, 308-nm XeCl excimer laser, 248 nm KrF excimer laser, 193 nm ArF excimer laser, etc.) are required in view of the fact that inspection is made by use of a light source for photolithography.

One of such image sensors is a CCD of the back illuminated type (e.g. Published Japanese Patent Application No. 6-29506). In the front side type CCD, transfer electrodes covering a photosensitive area are formed for example of polycrystalline silicon electrodes; however, the resulting sensitivity for ultraviolet radiation or else can decrease due to the fact that such polycrystalline silicon, in particular, absorbs incident energy rays of large absorption coefficient such as those rays with a wavelength less than or equal to 400 nm.

In contrast, the back illuminated type CCD is the one that makes use of a substrate with a thickness of approximately 10 to 30 $\mu$m for CCD formation and performs an image sensing/pickup operation upon receipt of incident energy rays from the back surface thereof; accordingly, it is possible to detect the light or else without obstruction by transfer electrodes as disposed on the front side, which in turn makes it possible to realize the intended CCD having high sensitivities even with respect to short-wavelength light (e.g. as less as about 200 nm) such as ultraviolet radiation. Such CCD is also effective for illumination of energy rays with large absorption coefficients such as y rays and/or charged particle rays in addition to the ultraviolet radiation. Optionally, it may also be applied as a CCD of the electron bombardment type.

SUMMARY OF THE INVENTION

In regard to the above-stated transfer electrodes made of polycrystalline silicon, there is a problem that the electrical resistivity is great as compared to the resistivity of metals. In particular, in cases where high-speed charge transfer is carried out in a vertical shift register of the CCD, the charge transfer speed or rate can be limited by the wiring resistivity of this polycrystalline silicon. In addition, a clock signal due to a transfer voltage being externally applied can often decrease in waveform sharpness in accordance with the large length of a wiring, resulting in distortion of waveform at certain locations, which in turn leads to occurrence of a difference in its rise-up time thus causing the CCD's transfer efficiency (ratio of charge transferred between potential wells) decreasing accordingly. Regarding this waveform sharpness reduction or "rounding," this is determinable by not only the resistivity but also a capacitance in combination therewith; however, a change in capacitance causes the CCD to likewise vary in amount of transferable charge therein so that the above-noted problem cannot be eliminated thereby.

For such the problem, CCDs using lower resistivity-reduced transfer electrodes having an intermediate layer made of a metal or metal silicide, a multilayer structure or a plated structure are set forth, for example, in Published Japanese Patent Application Nos. 63-46763 and 6-77461.

However, in these structures, shapes of electrical wirings using metals or the like are limited to specific shape and width similar to those of the transfer electrodes. At this time, in case picture elements or "pixels" are highly miniaturized in order to increase the image resolution, resultant interconnect wirings can decrease in width: even in the case of using metallic wirings as discussed previously, such wirings still suffer from an increase in resistivity, thereby making it impossible to obtain any sufficient charge transfer speeds. Additionally, in the case of large-area CCD chips also, an increase in wiring length would result in occurrence of similar high-resistivity problems.

The present invention has been made in view of the aforementioned problems and its object is to provide a semiconductor energy detector capable of transferring charge carriers at high speeds with high efficiency.

To attain the foregoing object, a semiconductor energy detector in accordance with the present invention is the semiconductor energy detector having on a front side of a CCD a group of transfer electrodes. Auxiliary wirings are directly connected to some of the transfer electrodes, and the other transfer electrodes are conencted via the additional wirings and corresponding transfer electrodes. While the auxiliary wirings and additional wirings are for causing the impedance due to the transfer electrodes to decrease to thereby enable achievement of high-speed/high-efficiency charge transfer, employing this wiring structure makes it possible to widen these wirings while at the same time improving the charge transfer at high speeds with high efficiency.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

One preferred embodiment of the semiconductor energy detector in accordance with the present invention will now be explained in detail with reference to the accompanying drawings below. Note that in an explanation of the drawings, the same elements are designated by the same reference characters with any duplicative explanation being omitted. Also note that size ratios of the drawings are not necessary identical to those as will be set forth below.

Figure 1:
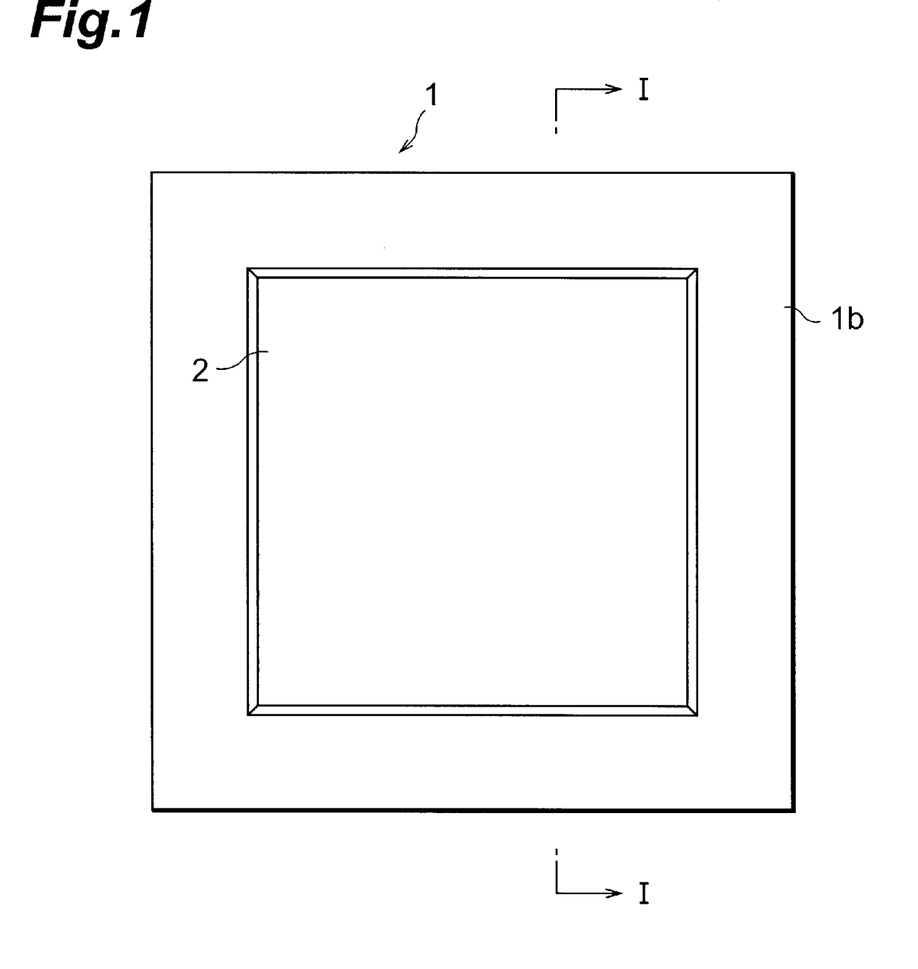
FIG. 1 is a diagram depicting a bottom view of one embodiment of a semiconductor energy detector of the back-illuminated type, when looking at from the back surface side thereof.
Figure 2:
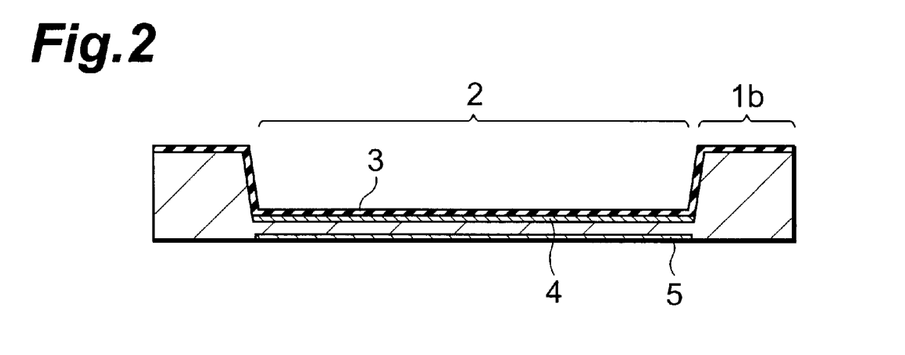
FIG. 2 is a diagram showing a sectional view of the semiconductor energy detector shown in FIG. 1 as taken along a line of arrows I—I.

An explanation will first be given of an arrangement and the like of a semiconductor energy detector of the back-illuminated type. FIG. 1 is a diagram showing a bottom view of one embodiment of the semiconductor energy detector of the back-illuminated type in accordance with the present invention, when looking at from the back side thereof. In addition, FIG. 2 is a diagram depicting a sectional view of the semiconductor energy detector shown in FIG. 1 as taken along arrow line I—I. Note here that in FIG. 2, the upper part of the drawing corresponds to the back surface side shown in FIG. 1 whereas the lower part is the front side on which a CCD is formed.

The semiconductor energy detector in the illustrative embodiment has a thickness of approximately 300 $\mu$m and specific resistivity ranging from about 10 to 100 $\Omega \cdot$cm, and is arranged on a P-type silicon substrate 1 with its face orientation (100). In the back illuminated type semiconductor energy detector, there are required thinning the substrate and formation of a potential slope (accumulation layer) near back-face incident plane. The substrate thinning prevents electrons as created through photoelectric conversion at part in close proximity to the incident plane from recombination prior to diffusion into a charge transfer potential well; in addition, shortening a distance between the substrate's back surface for photoelectric conversion and the front surface for charge transfer suppresses diffusion into neighboring pixels, which in turn makes it possible to degrade the resolution. On the other hand, formation of the potential slope (accumulation layer) near the back-face incident plane enables electrons as produced by photoelectric conversion at portions adjacent to the incident plane to readily diffuse into a potential well or wells for charge transfer. Such potential slope (accumulation layer) formation may be done by injection of boron ions and its activation thermal processing, by way of example.

In a back side region of the substrate 1 which contains a region corresponding to a photosensitive area, a thin section 2 with a thickness ranging from 10 to 30 $\mu$m (thus etched to a depth of about 270 to 290 $\mu$m) is formed within a substrate frame 1b which is a region with no etching applied thereto. With this thin section 2, it is possible to image pickup from the back surface, thereby constituting the back-illuminated type semiconductor energy detector having high sensitivity relative to ultraviolet radiation or the like.

The back side of the substrate 1 is such that as shown in FIG. 2, a silicon oxide film 3 for use as a protective film is formed to a thickness of about 0.1 $\mu$m for example while letting a $P^+$ high-impurity concentration layer 4 be formed at a substrate portion corresponding to the thin section 2. The $P^+$ high-impurity concentration layer 4 is formed to a thickness of about 0.2 $\mu$m with a concentration of about $5 \times 10^{18}/cm^3$, for example, and thus has a function of causing electrons as optically excited at part near the incident plane to diffuse toward the front side.

On the other hand, a CCD 5 is formed on the front side whereby the back-illuminated type semiconductor energy detector is constituted. More specifically, illumination from the back side is subjected to optical excitation in a certain region from the $P^+$ high-impurity concentration layer 4 up to the CCD 5, wherein excited electrons diffuse toward the CCD 5 and then reach a potential well of the CCD and are next integrated therein for detection and image pickup.

The structure having the above-noted thin section 2 is formed at a partway step in the wafer process of a CCD fabrication. Firstly, deposit a silicon nitride film on the silicon substrate 1; then, use photolithography process to pattern it into a desired shape; thereafter, with it being as a mask, etch the silicon substrate 1 using an etchant comprising KOH while permitting a chip peripheral portion being covered by the silicon nitride film to stay unetched.

Figure 3:
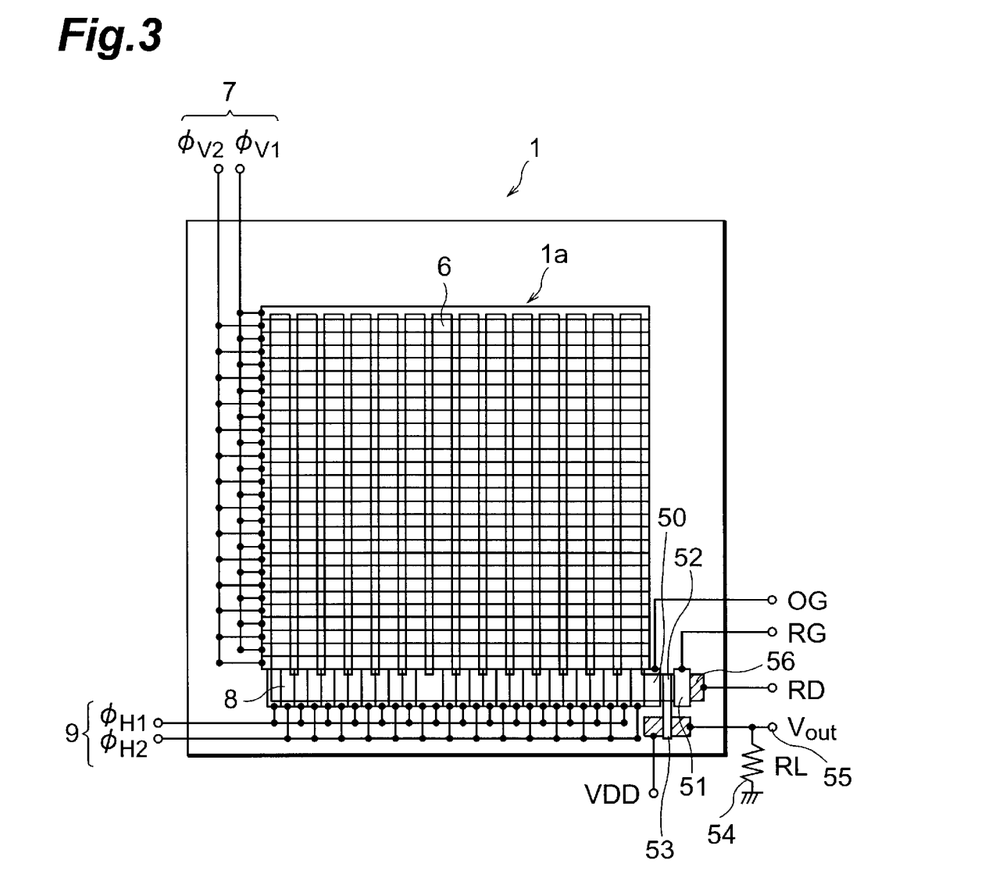
FIG. 3 is a diagram showing a top view of the semiconductor energy detector shown in FIG. 1 when looking at from the front side thereof.

FIG. 3 is a diagram showing a top view of the semiconductor energy detector shown in FIG. 1, when looking at from the front side thereof—in this embodiment, a FFT type CCD (including 20 $\mu$m$\times$20 $\mu$m pixels, for example, which are two-dimensionally laid out in 512, 1024 or 2048 columns in the horizontal direction and 128, 256 or 512 rows in the vertical direction) is formed as the CCD 5. It should be noted that for the purpose of explaining an operation of the FFT-type CCD, FIG. 3 only shows traditional transfer electrodes with regard to those electrodes and wirings used to transfer charge carriers while eliminating illustration of those wirings including the auxiliary wirings and additional wirings to be formed on the front side of the transfer electrodes in accordance with the present invention.

At a photosensitive area 1a on the front of the substrate 1, a plurality of columns of vertical transfer channels 6 with the vertical direction being as a charge transfer direction (e.g. with a width of about 20 μm and the column number is set at 512, 1024, or 2048) are laid out while disposing a vertical transfer electrode group 7 comprised of a plurality of vertical transfer electrodes made of polycrystalline silicon with a direction at right angles to the above-noted direction (horizontal direction in the drawing) being as a longitudinal direction, thereby to form a vertical shift register. In the vertical transfer electrode group 7, certain transfer electrodes to which transfer voltage with multiple phases—in FIG. 3, two-phase transfer voltages $\phi_{V1}$ and $\phi_{V2}$—are applied are arranged in a pair in such a way as to form at the photosensitive area 1a an array of a plurality of rows (e.g. with a width of about 20 μm and the column number is 128, 256, or 512) whereby a matrix-shaped two-dimensional pixel array at the photosensitive area 1a is configured while permitting execution of charge transfer toward the vertical direction.

A respective one of the vertical transfer channels 6 thus disposed is connected to a horizontal transfer channel 8 (having a width of about 25 to 100 μm, for example), and a horizontal transfer electrode group 9 which consists essentially of a plurality of horizontal transfer electrodes that extend perpendicularly thereto, thus forming a horizontal shift register. Note that for the vertical transfer electrode group 7, this group is divided into two, upper and lower regions in the case of an FT type CCD for formation of respective ones of the photosensitive area (upper region) and storage area (lower region).

Electrical charge carriers that have been integrated due to light absorption and image pickup in a potential well within a charge "integration" period are sequentially sent forth within a charge transfer period by the vertical shift register having the vertical transfer channels 6 and vertical transfer electrode group 7 and also the horizontal shift register having the horizontal transfer channels 8 and horizontal transfer electrode group 9, and then become a time-sequence signal. The charge carriers transferred pass through specific part underlying an output gate 50 that is kept at a constant potential level to be sent to a potential well of a floating diffusion AMP 52 that is kept by a reset gate 51 at a constant potential level, thereby letting the floating diffusion AMP 52 change in potential. This potential change is read out via a source follower circuit consisting essentially of an on-chip type FET 53 and a load resistor 54 as externally coupled thereto, thus obtaining an image output from an output terminal 55. Thereafter, the charge carriers that have been sent to the floating diffusion AMP 52 pass through certain part beneath the reset gate 51 and then are released out of a reset drain 56.

Note here that regarding the arrangement of the charge readout section on the front side, it should not be limited only to such FFT type CCD and may be modified into a semiconductor energy detector employing CCDs of other forms such as for example FT type CCDs.

An explanation will next be given of an arrangement or else of electrodes and auxiliary wirings in the semiconductor energy detector of the back-illuminated type in accordance with the present invention, based on one practical embodiment below. In the back-illuminated type semiconductor energy detector in accordance with the instant invention, a pattern of wirings having auxiliary wirings and additional wirings made of either metal or metal silicide is formed on the front side of vertical shift register transfer electrodes (referred to simply as "transfer electrodes" hereinafter) made of polycrystalline silicon constituting the vertical transfer electrode group 7 to thereby reduce electrical resistivities of those wirings for use in auxiliary application/supplement of transfer voltages, thus realizing the high-speed/high-efficiency charge transfer required.

Note that in respective diagrams below, the charge transfer directions and the like in the drawings are identical to those in FIG. 3. Accordingly, the longitudinal direction of transfer electrodes of the vertical transfer electrode group 7 is the horizontal (lateral) direction shown therein whereas the charge transfer direction of the vertical transfer channels 6 is the vertical (perpendicular) direction as depicted in the drawings.

Figure 4:
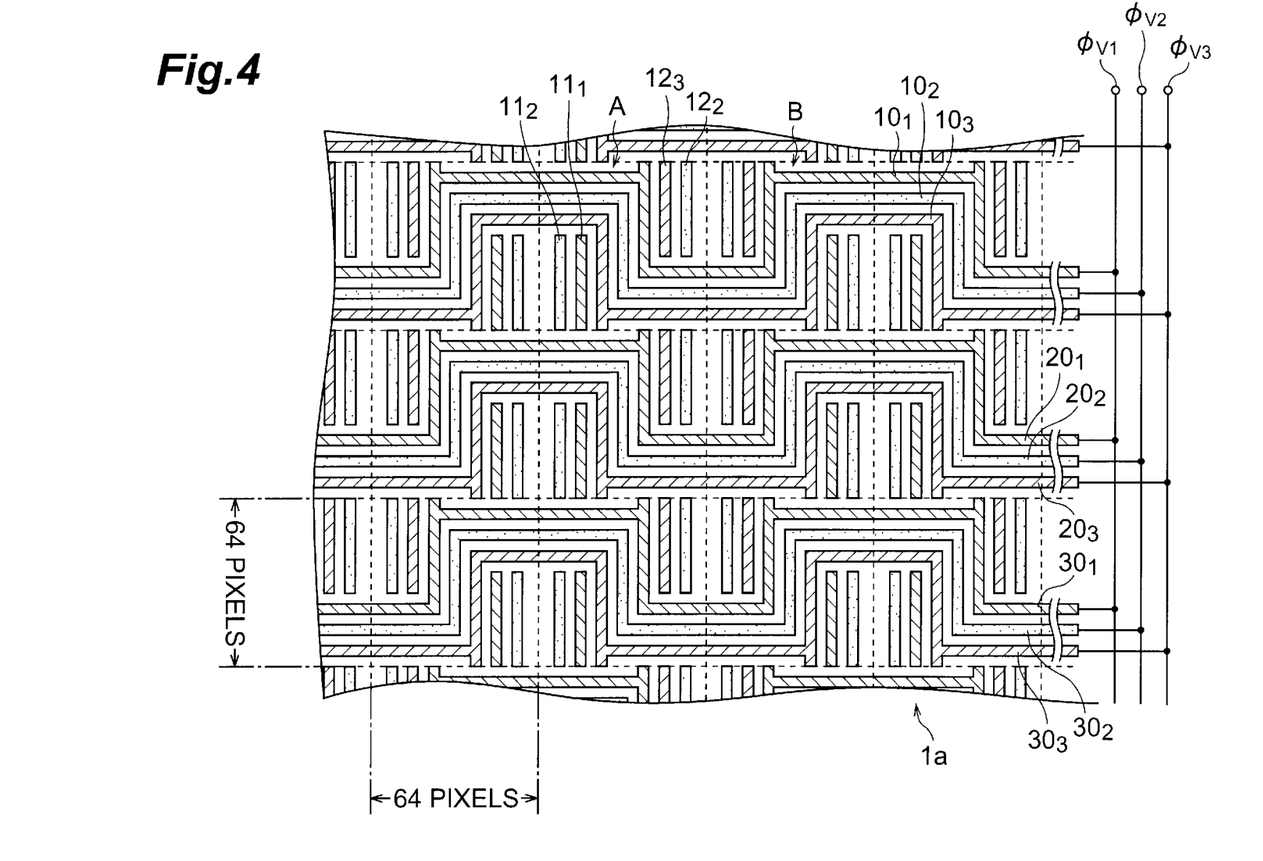
FIG. 4 is a plan view diagram showing one embodiment of a wiring pattern consisting essentially of auxiliary wirings and additional wirings as applied to the semiconductor energy detector of the back-illuminated type.

FIG. 4 is a top view diagram enlargedly showing part of one embodiment of the wirings consisting essentially of the auxiliary wirings and additional wirings of the present invention adaptable for use in the semiconductor energy detector of the back-illuminated type as shown in FIGS. 1 to 3. In the illustrative embodiment, its charge readout section is an FFT type CCD with a pixel array comprising a two-dimensional layout of 18 μm×18 μm pixels as disposed in 2048 columns in the horizontal direction and 512 rows in the vertical direction, the area of the overall photosensitive area being set at 36864×9216 μm².

The FFT type CCD in the embodiment shown herein is designed of the three-phase type using transfer voltages $\phi_{V1}$, $\phi_{V2}$, $\phi_{V3}$ of three different phases, wherein transfer electrodes (not depicted) with the horizontal direction being as the longitudinal direction thereof are such that three transfer electrodes to which the transfer voltages $\phi_{V1}$, $\phi_{V2}$, $\phi_{V3}$ are respectively applied are disposed with respect to each pixel row (one-dimensional pixel array in the horizontal direction).

A front side of the transfer electrodes is such that an oxide film, which is a dielectric film, is formed on the entire surface thereof, wherein auxiliary wirings and additional wirings made of a metal or metal silicide, preferably aluminum, are formed on the upper face of this oxide film. Especially, in this embodiment, as shown in FIG. 4, these auxiliary wirings and additional wirings are formed of a wiring pattern using a single layer of aluminum which may readily be formed even on or over thin substrate portions. In addition, contact holes of the through hole shape which are used as connection portions for electrical connection between the transfer electrodes and respective portions of the wiring pattern are formed in the oxide film at specified portions as will be later described in the description.

The aluminum wiring pattern in the embodiment shown in FIG. 4 is such that as boundary lines (virtual lines) of its repeated structure have been shown by use of dotted lines in the drawing, a wiring pattern is formed by a wiring structure with 64 pixels being as its repeat period with respect to the vertical direction. Additionally, for the horizontal direction, 128 pixels are the repeat period thereof; however, respective regions as two-divided from its single pattern—e.g. a region "A" and a region "B" in the drawing—are formed in a linear symmetrical fashion about their boundaries; accordingly, their boundaries are shown in the drawing with 64 pixels being as the repeat period with respect to the horizontal direction also.

The auxiliary wirings in this embodiment are designed so that while three auxiliary wirings to which three-phase transfer voltages $\phi_{V1}$, $\phi_{V2}$, $\phi_{V3}$ are applied respectively are arranged in one set, a single set of auxiliary wirings is formed relative to each row of the repeated structure of the wiring pattern; thus, a set of three auxiliary wirings is formed for 64×3 transfer electrodes of 64 pixels with respect to the vertical direction also. In this way, letting three auxiliary wirings be arranged in one set with respect to three-phase voltage for example to thereby provide its repeated structure in the way stated above makes it possible to efficiently perform application/supplement of transfer voltages required. In FIG. 4, there are shown a first set of three auxiliary wirings $10_1$–$10_3$ at the first row of the repeated structure in the drawing, a second row of auxiliary wirings $20_1$–$20_3$, and a third row of auxiliary wirings $30_1$–$30_3$, to which the transfer voltages $\phi_{V1}$, $\phi_{V2}$, $\phi_{V3}$ are applied respectively.

These auxiliary wirings $10_1$–$10_3$, $10_1$–$10_3$, $20_1$–$20_3$, $30_1$–$30_3$ are such that any one of them is formed in such a manner that its width measures 72 μm corresponding to 4 pixels in the pixel array of the photosensitive area 1a. In this way, employing the auxiliary wirings having the width greater than the pixel width rather than those due to plated electrodes or else which are almost identical in width to respective transfer electrodes makes it possible to perform auxiliary application/supplement of transfer voltages via wirings with sufficiently lowered resistivities, which in turn enables achievement of high-speed/high-efficiency charge transfer.

In the case of the arrangement of such auxiliary wirings each of which has its width corresponding to a plurality of pixels, respective auxiliary wirings would undesirably cover the upper face side of a plurality of pixel regions, resulting in an arrangement with only an auxiliary wiring that corresponds to a single-phase transfer voltage being present on the upper face side of three (three-phase) transfer electrodes with respect to one pixel row in cases where the auxiliary wirings are laid out for example in parallel to the transfer electrodes as in the prior art; accordingly, more than one transfer electrode must exist which is incapable of performing auxiliary application/supplement of transfer voltages. In contrast, the illustrative embodiment is specifically arranged so that as shown in FIG. 4, the auxiliary wirings $10_1$–$10_3$, $20_1$–$20_3$, $30_1$–$30_3$ are designed in shape to meander. Additional wirings—e.g. additional wirings 111, 112 and 122, 123 in the region "A"—are formed in a region between them in a way independent of the auxiliary wirings, thereby realizing auxiliary supplement of transfer voltages to all the transfer electrodes involved.

Figure 5:
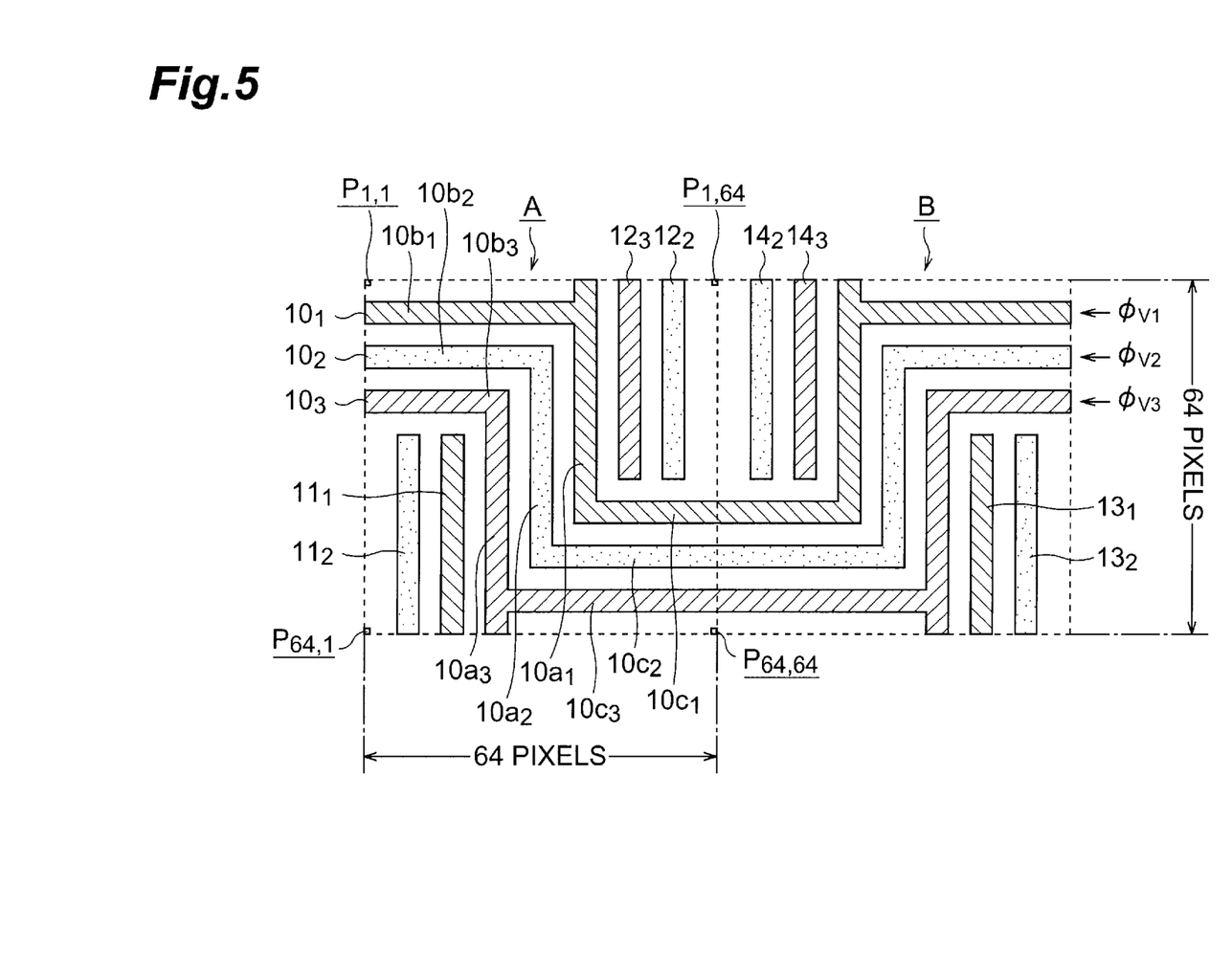
FIG. 5 is a diagram depicting an enlarged plan view of the wiring pattern shown in FIG. 4.

FIG. 5 is a top view diagram enlargedly showing part of the wiring pattern shown in FIG. 4, relating to the regions "A" and "B" of the repeat structure thereof. An explanation below is devoted in particular to one specific part—i.e. the wiring structure of the region A corresponding to a single pattern of wirings having the repeat structure. Formed as wirings made of aluminum in the region A are the auxiliary wirings $10_1$–$10_3$ which are disposed to pass through inside of the region A and the additional wirings $11_1$, $11_2$, $12_2$, $12_3$ that are disposed within the region A.

As described above, the region A corresponds to an array structure of 64 rows and 64 columns of pixels. Here, let an upper left pixel of the region A in FIG. 5 be the origin, and a certain pixel at an "i"-th row and "j"-th column be represented by a symbol $P_{i,j}$ (i=1 to 64, j=1–64). Additionally, let a portion between a pixel $P_{i,j}$ at the j-th column and a pixel $P_{i,j+1}$ at (j+1)th column be given by inter-pixel portion $C_{i,j}$. In addition, three transfer electrodes corresponding to three-phase transfer voltages $\phi_{V1}$, $\phi_{V2}$, $\phi_{V3}$ as formed with the horizontal direction relative to an i-th pixel row (corresponding to pixels $P_{i,1}$-$P_{1,64}$) being as the longitudinal direction thereof are represented by reference characters $71_1$, $72_i$, $73_1$, respectively.

A respective one of the auxiliary wirings $10_1$–$10_3$ and additional wirings $11_1$, $11_2$, $12_2$, $12_3$ is formed to have its width of 72 μm corresponding to four pixels to thereby sufficiently reduce the resistivity of each wiring. In addition, as for distances between respective wirings, all are set at 72 μm corresponding to four pixels identical to the width of each wiring, expect that a region on the left side of additional wiring $11_2$ and a region on the right side of additional wiring $12_2$ are each set at a length of six pixels (108 μm).

A portion formed within the region A of the auxiliary wirings $10_1$–$10_3$ is constituted from vertical auxiliary wirings $10a_1$–$10a_3$ that are formed in a vertical direction at a nearby location to a central portion of the region A and horizontal auxiliary wirings $10b_1$–$10b_3$, $10c_1$–$10c_3$ which are formed in a horizontal direction on the both sides of the vertical auxiliary wirings $10a_1$–$10a_3$ in order to constitute the auxiliary wirings $10_1$–$10_3$ by letting the vertical auxiliary wirings $10a_1$–$10a_3$ be connected to other wiring portions of the auxiliary wirings $10_1$–$10_3$ as formed within right and left regions of the region A respectively. On the other hand, additional wirings $11_1$, $11_2$, $12_2$, $12_3$ are structured from only vertical additive wirings since any connection with wirings within other regions is not necessary.

Additionally, in regard to the right-and-left positional relationship of respective ones of the additional wirings $11_1$, $11_2$ and additional wirings $12_2$, $12_3$ in the drawing, the additional wirings $11_2$ and $12_2$ are disposed at outside locations respectively to ensure that a distance with respect to a corresponding vertical auxiliary wiring becomes equal.

Regarding connection of respective wirings, a plurality of contact holes that are through holes are formed in the oxide film overlying respective corresponding transfer electrodes at the center portion in the along-the-width direction thereof with respect to certain wiring portions in the vertical direction, that is, the vertical auxiliary wirings $10a_1$–$10a_3$ and additional wirings $11_1$, $11_2$, $12_2$, $12_3$; thus, electrical connection between respective wirings and associative transfer electrode is performed by aluminum within the contact holes.

More specifically, the vertical auxiliary wiring $10a_1$ with a transfer voltage $\phi_{V1}$ being applied thereto is connected to corresponding transfer electrodes $71_1$–$71_{44}$ at interpixel portions $C_{1,40}$ to $C_{44,40}$; the vertical auxiliary wiring $10a_2$ with a transfer voltage $\phi_{V2}$ being applied thereto is connected to corresponding transfer electrodes $72_{13}$–$72_{52}$ at interpixel portions $C_{13,32}$ to $C_{52,32}$; and, the vertical auxiliary wiring $10a_3$ with a transfer voltage $\phi_{V3}$ being applied thereto is connected to corresponding transfer electrodes $73_{21}$–$73_{64}$ at interpixel portions $C_{21,24}$ to $C_{64,24}$.

In addition, the additional wiring $11_1$ is connected to corresponding transfer electrodes $71_{29}$–$71_{64}$ at interpixel portions $C_{29,16}$–$C_{64,16}$; the additional wiring $11_2$ is connected to corresponding transfer electrodes $72_{29}$–$72_{64}$ at interpixel portions $C_{29,8}$–$C_{64,8}$; the additional wiring $12_2$ is connected to corresponding transfer electrodes $72_1$–$72_{36}$ at interpixel portions $C_{1,56}$–$C_{36,56}$; the additional wiring $12_3$ is connected to corresponding transfer electrodes $73_1$–$73_{36}$ at interpixel portions $C_{1,48}$–$C_{36,48}$.

Figure 6:
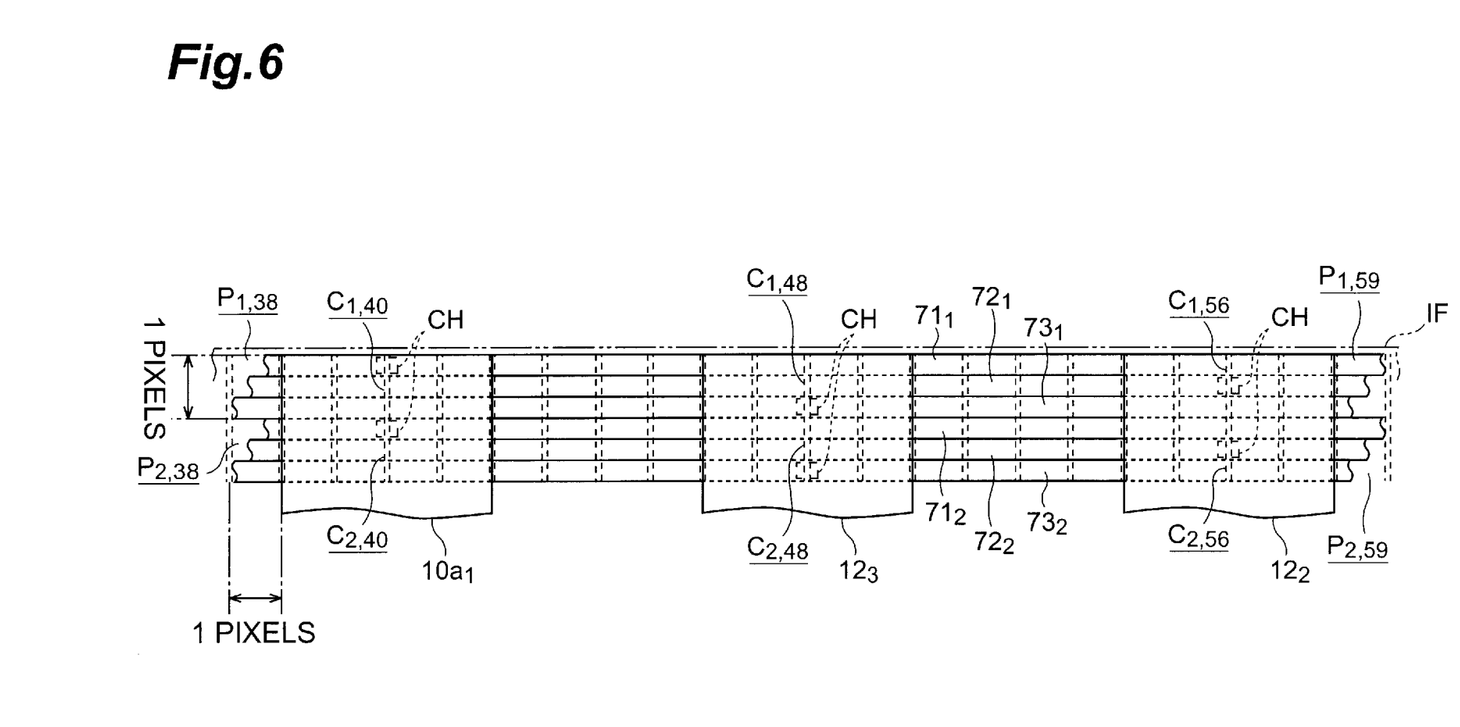
FIG. 6 is a plan view diagram showing a method of connecting wirings and electrodes while enlargedly depicting part of the wiring pattern shown in FIG. 5.
Figure 7A:
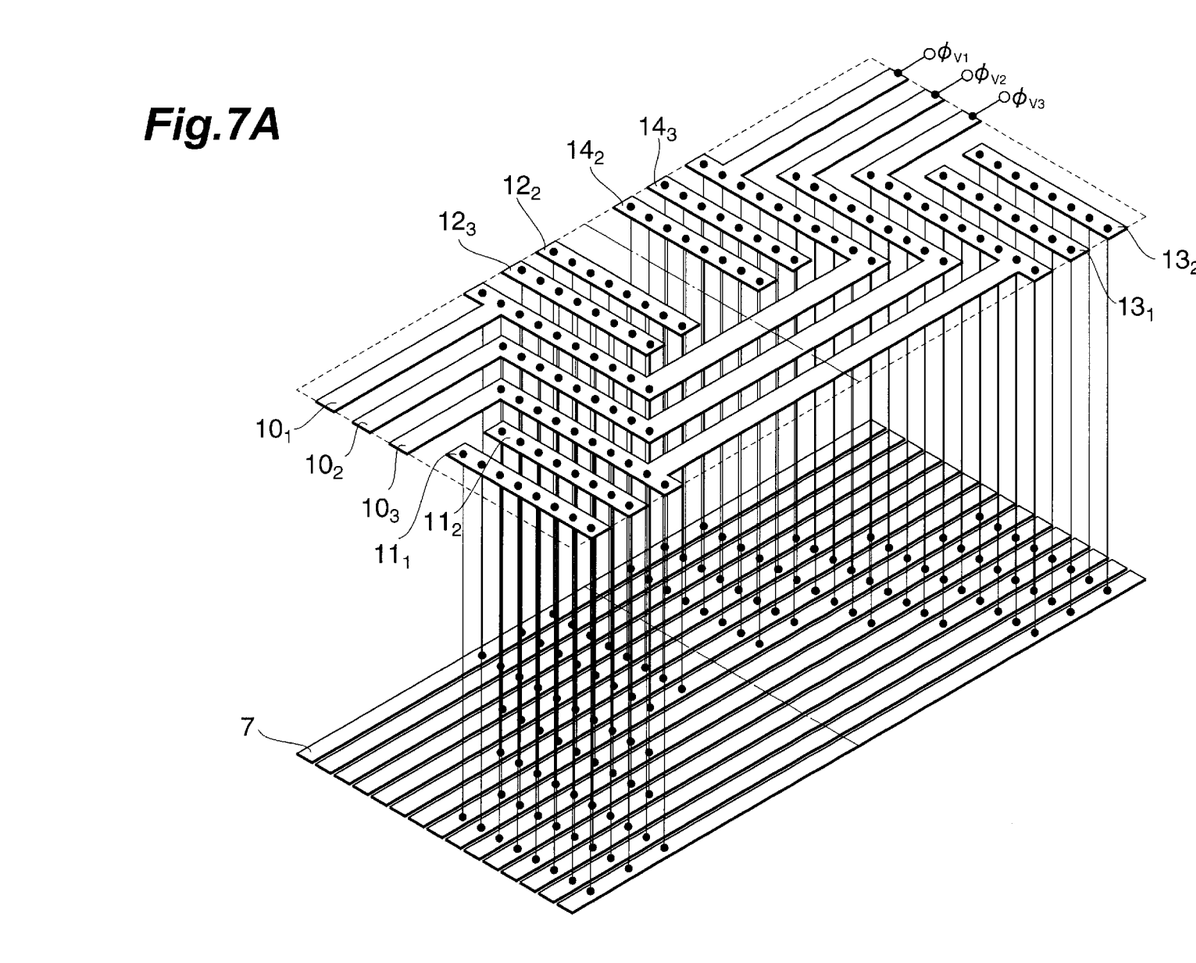
FIG. 7A is a perspective view diagram showing a wiring section in a disassembled form for explanation of summary of the connection relation stated above.

FIG. 7A is a perspective view diagram showing in disassembled form a wiring section for explanation of summary of the connection relationship stated above. Here, for purposes of convenience in illustration, assume that 15 rows of transfer electrodes 7 are provided for an array of 15 rows and 15 columns of pixels and that a single transfer electrode 7 includes electrodes $71_i$, $72_i$, $73_i$ in one pixel shown in FIG. 6. As shown in the drawing, auxiliary wirings $10_1$–$10_3$ are directly connected to some of the transfer electrodes 7, and the other transfer electrodes 7 are connected via the additional wirings $11_1$, $11_2$, $12_2$, $12_3$, $13_1$, $13_2$, $14_2$, $14_3$, and corresponding transfer electrodes 7. These are such that they are connected via contact holes.

Figure 7B:
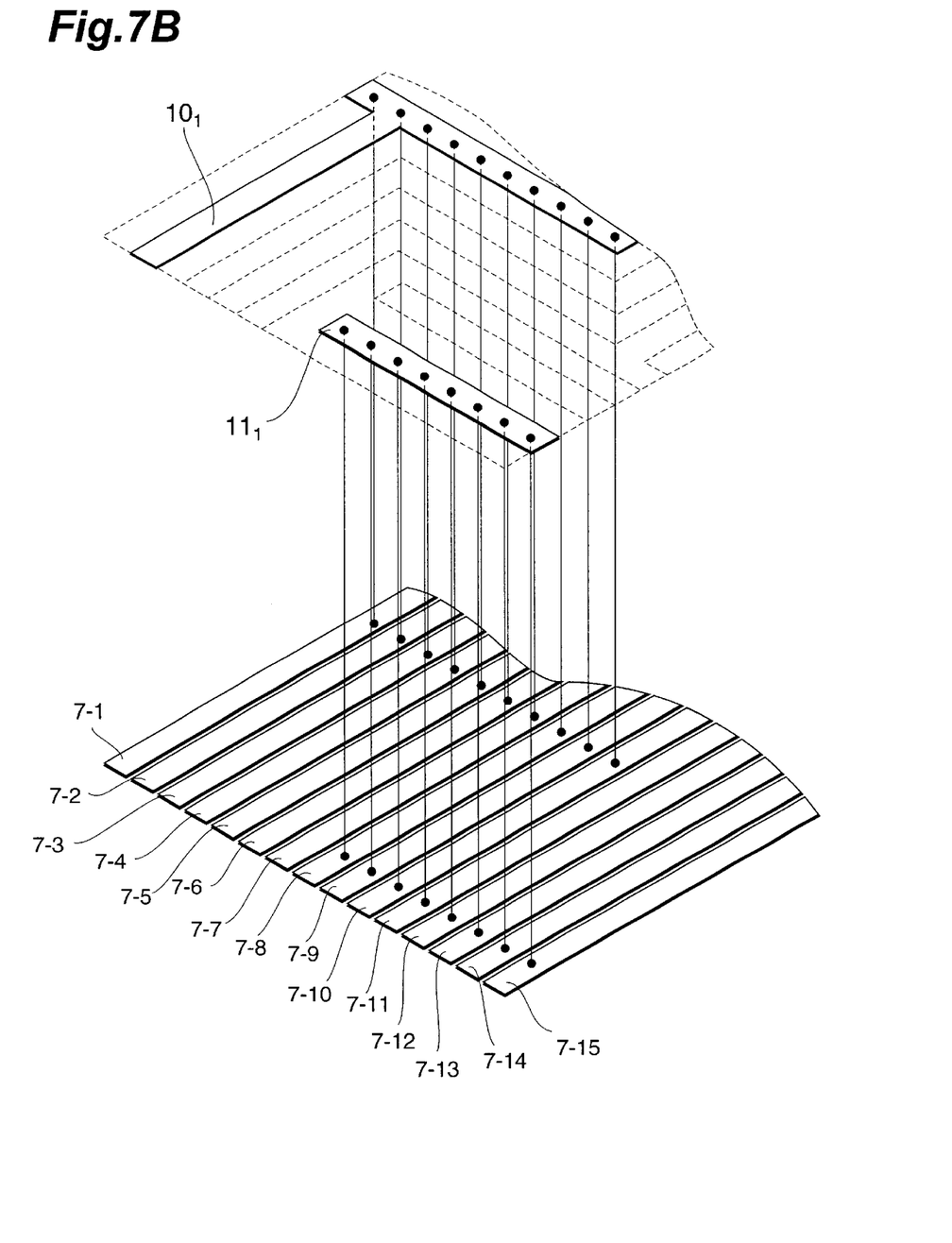
FIG. 7B is a perspective view diagram enlargedly showing part of the wiring section shown in FIG. 7A.

For example, as shown in FIG. 7B, the auxiliary wiring $10_1$ is directly connected via contact holes to several transfer electrodes 7, wherein 7–8 to 7–10 of them are connected to auxiliary wiring $10_1$ and additional wiring $11_1$ and the remaining 7–11 to 7–15 which are not directly connected to the auxiliary wiring $10_1$ are connected together by additional wiring 111. A detailed explanation as to the connection will be given below.

FIG. 6 shows, in enlarged form, a method for connection between the above-noted transfer electrodes and respective wirings associated therewith in conjunction with a pixel region (1 and 2 rows, 38 to 59 columns) of pixels $P_{11,38}$ to $P_{2,59}$. The vertical auxiliary wiring $10a_1$ of auxiliary wiring $10_1$ is being applied a transfer voltage $\phi_{V1}$: within the region as depicted herein, contact holes CH are provided with respect to corresponding transfer electrodes $71_1$ and $71_2$ at interpixel portions $C_{1,40}$ and $C_{2,40}$ thereby letting them be electrically connected to each other by aluminum within such contact holes CH.

In addition, the additional wiring $12_3$ is for supplement of transfer voltage $\phi_{V3}$ and is connected via contact holes CH to corresponding transfer electrodes $73_1$ and $73_2$ at interpixel portions $C_{1,48}$ and $C_{2,48}$. Similarly the additional wiring $12_2$ is for supplement of transfer voltage $\phi_{V2}$ and is connected via contact holes CH to corresponding transfer electrodes $72_1$ and $72_2$ at interpixel portions $C_{1,56}$ and $C_{2,56}$.

Note that regarding the wiring structure of the region "B," such is formed line-symmetrically with the region "A" as to its wiring pattern and relationship of connection to transfer electrodes and the like, as has been discussed previously. More specifically, the auxiliary wirings $10_1$–$10_3$ are formed so that these are connected by a line-symmetrical shape to wiring portions within the region A, as shown in FIG. 5. Additionally, regarding the additional wirings, additional wirings $13_1$ and $13_2$ correspond to additional wirings $11_1$ and $11_2$ respectively and are for auxiliary supplement of transfer voltages $\phi_{V1}$, $\phi_{V2}$; additional wirings $14_2$ and $14_3$ correspond to additional wirings $12_2$ and $12_3$ respectively and are for auxiliary supplement of transfer voltages $\phi_{V2}$, $\phi_{V3}$. Regarding the remaining regions within the photosensitive area also, respective wiring patterns are formed by a repeated structure of the structures which have already been indicated with respect to the regions A and B.

The auxiliary wirings and additional wirings along with transfer voltage application/supplement due to connection between them and transfer electrodes and others will now be explained on the basis of the arrangement in the above-noted region A.

With the auxiliary wirings made of metal or else in the semiconductor energy detector in accordance with the present invention, the auxiliary wirings for performing auxiliary application/supplement of transfer voltages are designed for example to consist of vertical auxiliary wirings and horizontal auxiliary wirings and have a shape that forms a meander pattern, while forming in a region defined therebetween an additional wiring which is not directly connected to the auxiliary wirings and performing auxiliary transfer voltage supplement, thus realizing the intended auxiliary application or supplement of transfer voltages to all the transfer electrodes involved.

More specifically, with regard to $\phi_{V1}$ of three-phase transfer voltages, the vertical auxiliary wiring $10a_1$ of auxiliary wiring $10_1$ is connected to respective corresponding transfer electrodes at first to 44th rows of the pixel array whereas additional wiring $11_1$ is connected to corresponding transfer electrodes at 29th to 64th rows respectively. In this arrangement, concerning transfer electrodes at 1st to 44th rows, a transfer voltage is applied/supplied from the auxiliary wiring $10_1$. On the other hand, as for transfer electrodes at 29th to 44th rows, the auxiliary wiring $10_1$ and additional wiring $11_1$ are both connected thereto with the transfer voltage from the auxiliary wiring $10_1$ being supplied to additional wiring $11_1$ through the transfer electrodes at 29th to 44th rows. Whereby, regarding those transfer electrodes at 45th to 64th rows with no transfer voltages being applied/supplied from the auxiliary wiring $10_1$ also, a transfer voltage is supplied thereto via additional wiring $11_1$.

Similarly, with regard to $\phi_{V2}$, the vertical auxiliary wiring $10a_2$ of auxiliary wiring $10_2$ is connected to respective corresponding transfer electrodes at 13rd to 52nd rows, additional wiring $11_2$ is connected to respective corresponding transfer electrodes at 29th to 64th rows, and additional wiring $12_2$ is connected to respective corresponding transfer electrodes at 1st to 36th rows. In this arrangement, as for the transfer electrodes at 13rd to 52nd rows, a transfer voltage is applied/supplied from the auxiliary wiring $10_2$. Furthermore, in regard to those transfer electrodes at 53rd to 64th rows with no transfer voltages being applied/supplied from the auxiliary wiring $10_2$ also, a transfer voltage is supplied thereto via additional wiring $11_2$; regarding transfer electrodes at first to twelfth rows with no transfer voltages being applied/supplied from the auxiliary wiring $10_2$ also, a transfer voltage is supplied via additional wiring $12_2$.

In addition, regarding $\phi_{V3}$, the vertical auxiliary wiring $10a_3$ of auxiliary wiring 103 is connected to respective corresponding transfer electrodes at 21st to 64th rows whereas the additional wiring $12_3$ is connected to respective corresponding transfer electrodes at 1st to 36th rows. In this arrangement, as for transfer electrodes at 21st to 64th rows, a transfer voltage is applied/supplied from the auxiliary wiring $10_3$. Furthermore, as for those transfer electrodes at 1st to 20th rows with no transfer voltages being applied/supplied from the auxiliary wiring $10_3$ also, a transfer voltage is supplied thereto via additional wiring $12_3$.

In the way stated supra, use of the wiring pattern comprising the auxiliary wirings and additional wirings in accordance with the embodiment shown in FIGS. 4 to 6 makes it possible to accomplish auxiliary application or supplement of transfer voltages with corresponding phases to all the transfer electrodes concerned. Since this auxiliary application or supplement is done by use of auxiliary wirings and additional wirings made of a metal or metal silicide as formed separately from those transfer electrodes made of polycrystalline silicon, it becomes possible, even in cases where pixels are reduced in size for enhancement of the image resolution, to transmit drive clocks of respective phases at high speeds in the state that any possible distortion in waveform is suppressed, which in turn enables achievement of electrical charge transfer at high speeds with increased efficiency. For example, with the wiring pattern stated above, the resultant resistivity may be reduced to about one 100th, when compared to the case of using aluminum back-plated wirings for the conventional transfer electrodes.

It should be noted that in a view point of fabrication processes also, widenning of wirings thereof as in the aforesaid wiring pattern results in a decrease in wiring patterning accuracy, whereby it becomes possible to improve production yields while simplifying fabrication processes.

The semiconductor energy detector in accordance with the present invention should not be limited only to the embodiment discussed above and may be modified and altered in a variety of different forms. For example, with regard to the number of the phases for CCD drive, the wiring pattern of the present invention may also be applied to drive methods of single phase, two-phase, or four-phase and the like other than the three-phase drive. Additionally, even in such drive schemes other than three-phase, it is possible to efficiently supply/apply transfer voltages by letting n auxiliary wirings with n-phase transfer voltages applied thereto be arranged in one set with respect to n-phase transfer voltages and also using a repeated structure thereof.

Note that as for the shapes of the auxiliary wirings and additional wirings, a variety of shapes will be possible.

Also note that although in the above-stated embodiment the auxiliary application or supplement of transfer voltages is performed for all the transfer electrode involved, this may be modified into an alternative arrangement wherein such auxiliary application or supplement of transfer voltages is done only for certain ones of the transfer electrodes within a range in which the required charge transfer speed and efficiency are maintained. For example, although in the above embodiment three auxiliary wirings are arranged in one set with respect to transfer voltages of three-phase drive, it is possible by using a structure with two auxiliary wirings paired for three-phase drive to provide an arrangement with increased charge transfer speed.

Additionally, regarding the wiring material of the auxiliary wirings and additional wirings, other metals such as for example Cu, Ti, W, Mo, Ta, et cetera or alternatively metal silicides such as $TiSi_2$, $WSi_2$, $MoSi_2$, $TaSi_2$, $NbSi_2$ or else may be used therefor.

While the auxiliary wirings and additional wirings are for reduction of the impedance due to transfer electrodes to thereby enable achievement of high-speed/high-efficiency charge transfer, employing this wiring structure makes it possible to widen these wirings while at the same time improving the high-speed/high-efficiency charge transfer.

Explaining in more detail, the aforesaid semiconductor energy detector is the semiconductor energy detector wherein a charge readout section comprised of the charge coupled device 5 is formed on the front side of the semiconductor substrate 1 and the thin section 2 with part of semiconductor being removed away is formed on the back side of the semiconductor substrate 1 while permitting energy rays to illuminate from the back side of the semiconductor substrate 1, the charge readout section 5 having its wiring structure arranged as will be described below.

The charge readout section 5 includes a photosensitive area 1a arranged to have a two-dimensional pixel array for letting incident energy rays be detected, a plurality of transfer electrodes $73_i$ which are formed respectively on the front side of the photosensitive area 1a with a first direction in the two-dimensional pixel array being as the longitudinal direction thereof and to which transfer voltages (charge transfer voltages) for performing charge transfer as to a second direction in the two-dimensional pixel array, auxiliary wirings $10_1$–$10_3$, $20_1$–$20_3$, $30_1$–$30_3$ made of metal or metal silicide as formed on the front side of the transfer electrodes $73_1$ for being applied transfer voltages, and additional wirings $11_1$, $11_2$, $12_2$, $12_3$, $13_1$, $13_2$, $14_2$, $14_3$ made of metal or metal silicide on the front side of the transfer electrodes $73_i$, which additional wirings are not directly connected to (electrically independent from) the auxiliary wirings $10_1$–$10_3$, $20_1$–$20_3$, $30_1$–$30_3$.

Respective auxiliary wirings $10_1$–$10_3$, $20_1$–$20_3$, $30_1$–$30_3$ are electrically connected directly to the plurality of transfer electrodes $73_i$ including at least two transfer electrodes that are disposed so that they are spaced part from each other with a distance greater than the width of the auxiliary wirings $10_1$–$10_3$, $20_1$–$20_3$, $30_1$–$30_3$ in the second direction, and are for auxiliary application/supplement of transfer voltages.

Respective additional wirings $11_1$, $11_2$, $12_2$, $12_3$, $13_1$, $13_2$, $14_2$, $14_3$ are electrically connected to the plurality of transfer electrodes $73_i$ including at least one transfer electrode $73_i$ as electrically connected to the auxiliary wirings $10_1$–$10_3$, $20_1$–$20_3$, $30_1$–$30_3$ and at least one transfer electrode that is not directly connected to (electrically independent from) the auxiliary wirings $10_1$–$10_3$, $20_1$–$20_3$, $30_1$–$30_3$ and are for auxiliarily supplying transfer voltages.

In the semiconductor energy detector stated above, low-resistance wirings for realizing the charge transfer at high speeds are constituted not from back-plated wirings or else but from auxiliary wirings made of metal or metal silicide as formed separately from the transfer electrodes $73_i$ on the front side thereof. These wirings are made up of the auxiliary wirings $10_1$–$10_3$, $20_1$–$20_3$, $30_1$–$30_3$ and additional wirings $11_1$, $11_2$, $12_2$, $12_3$, $13_1$, $13_2$, $14_2$, $14_3$.

Of these wirings, the auxiliary wirings $10_1$–$10_3$, $20_1$–$20_3$, $30_1$–$30_3$ are formed into a shape that is not parallel to the transfer electrodes $73_i$ and is capable of connection to a plurality of transfer electrodes including transfer electrodes spaced apart from each other with a distance greater than the width of auxiliary wirings $10_1$–$10_3$, $20_1$–$20_3$, $30_1$–$30_3$ in the direction of charge transfer, such as for example a shape that meanders. Respective auxiliary wirings $10_1$–$10_3$, $20_1$–$20_3$, $30_1$–$30_3$ are being applied specific corresponding transfer voltages whereby auxiliary application/supplement of transfer voltages to the transfer electrodes $73_i$ via low-resistance auxiliary wirings is performed.

In case of such shape of the auxiliary wirings $10_1$–$10_3$, $20_1$–$20_3$, $30_1$–$30_3$, problems can occur such as an inability to apply/supply transfer voltages by auxiliary wirings to certain ones of the transfer electrodes, depending on the wiring pattern such as the meander auxiliary wirings. To avoid the problem, form the additional wirings $11_1$, $11_2$, $12_2$, $12_3$, $13_1$, $13_2$, $14_2$, $14_3$ in regions among respective auxiliary wirings $10_1$–$10_3$, $20_1$–$20_3$, $30_1$–$30_3$ in a way independent of the auxiliary wirings $10_1$–$10_3$, $20_1$–$20_3$, $30_1$–$30_3$. No transfer voltages are directly supplied to these additional wirings $11_1$, $11_2$, $12_2$, $12_3$, $13_1$, $13_2$, $14_2$, $14_3$. For connection between those transfer electrodes with auxiliary application/supplement of transfer voltages being done by the auxiliary wirings $10_1$–$10_3$, $20_1$–$20_3$, $30_1$–$30_3$ and the other transfer electrodes permits effectuation of auxiliary supplement of transfer voltages to the transfer electrodes with no auxiliary wirings connected thereto via the transfer electrodes to which both the auxiliary wirings $10_1$–$10_3$, $20_1$–$20_3$, $30_1$–$30_3$ and the additional wirings $11_1$, $11_2$, $12_2$, $12_3$, $13_1$, $13_2$, $14_2$, $14_3$ are connected.

With use of the wiring pattern due to the auxiliary wirings and additional wirings whose connection is arranged in the way stated above, it is possible, even in the case of a variety of auxiliary wiring shapes such as the meander-like pattern, to attain an arrangement capable of auxiliarily applying or supplying transfer voltages to all the transfer electrodes involved. Especially, co-use of additional wirings with respect to those auxiliary wirings being applied transfer voltages while employing wirings to thereby realize transfer voltage supplement to the entirety makes it possible to greatly increase the degree of freedom of the wiring pattern and shape and others, thus enabling application and accomplishment of a variety of different wiring patterns capable of achieving charge transfer at high speeds with high efficiency in accordance with the aimed performance and practical CCD arrangement or else.

Another feature is that the auxiliary wirings $10_1$–$10_3$, $20_1$–$20_3$, $30_1$–$30_3$ and additional wirings $11_1$, $11_2$, $12_2$, $12_3$, $13_1$, $13_2$, $14_2$, $14_3$ are formed so that the width thereof is greater than a width per pixel in the two-dimensional pixel array.

In the case of a back illuminated type CCD, it is possible by designing the wiring width so that it is larger than the width of transfer electrode $73_i$ to further reduce the resistivity of such wirings because of the fact that the aperture ratio relative to introduction or incidence of energy rays does not receive any limitation due to the wirings made of metal or else as formed on the front side. In this case, such wirings are incapable of fabrication by back plating or the like with respect to the transfer electrodes $73_i$—for example, as shown in FIG. 6, a method may be used for connection between transfer electrodes and respective portions of the wirings by contact holes CH of the through-hole shape as provided at specified locations of a dielectric film IF through the process steps of forming the dielectric film IF on the front side of the transfer electrodes $73_i$ and then forming on this dielectric film IF a pattern of wirings made of metal. At this time, in case the width of auxiliary wirings $10_1$–$10_3$, $20_1$–$20_3$, $30_1$–$30_3$ is made larger than the width of each pixel by way of example, disposing the auxiliary wirings $10_1$–$10_3$, $20_1$–$20_3$, $30_1$–$30_3$ in parallel to the transfer electrodes $73_i$ can result in presence of a transfer electrode or electrodes that are incapable of performing any intended auxiliary application/supplement of transfer voltages depending upon the width thereof.

In contrast, use of the wiring structure consisting essentially of the aforementioned auxiliary wirings and additional wirings makes it possible, even where the width of wirings made of metal or else is greater than the pixel width in the way stated supra, to perform application or supplement of transfer voltages to all the transfer electrodes concerned, which in turn enables achievement of the intended semiconductor energy detector capable of realizing charge transfer at high speeds with high efficiency. Additionally, even when the wiring width is increased in this way, the resulting wiring capacitance for example is hardly changed in value due to the fact that appropriate designing of the layout thereof permits the total area of such wirings to remain almost identical to the prior art.

It should also be noted that the auxiliary wirings $10_1$–$10_3$, $20_1$–$20_3$, $30_1$–$30_3$ and the additional wirings are formed of a wiring pattern comprised of metals or metal silicides $11_1$, $11_2$, $12_2$, $12_3$, $13_1$, $13_2$, $14_2$, $14_3$ as formed in a single layer. In other words, these are made of metals or metal silicides of the same kind along the thickness direction thereof.

As previously stated, with the back-illuminated type CCD, there are no limitations due to the aperture ratio with respect to the wirings made of metal or else on the front side; however, on the other hand, the photosensitive area has a thickness of about 10 to 30 μm, resulting in occurrence of flexure or deflection of the area due to such reduced thickness, which in turn makes it difficult to attain successful patterning of metals or else, in particular, very difficult to fabricate a multilayer wiring structure. In contrast, according to the wiring pattern using the wiring structure comprising the above-stated auxiliary wirings and additional wirings, it is possible even by use of a single-layered wiring structure to provide the arrangement capable of performing auxiliary application or supplement of transfer voltages to all the transfer electrodes.

One preferable example of the wiring pattern structure is that this is characterized in that respective auxiliary wirings have for example a plurality of vertical auxiliary wirings $10a_1$–$10a_3$ that are formed in parallel to the second direction with connection portions with transfer electrodes being disposed therein, and horizontal auxiliary wirings $10b_1$–$10b_3$, $10c_1$–$10c_3$ as formed in parallel to the first direction for connection among the vertical auxiliary wirings $10a_1$–$10a_3$, wherein respective additional wirings are designed so that connection portions with the transfer electrodes being formed in parallel to the second direction are disposed therein.

In addition, with regard to the correspondence with the transfer electrodes, letting for example the charge readout section consisting essentially of a charge coupled device be designed so that n-phase transfer voltages are used to perform the intended charge transfer while letting the auxiliary wirings be featured in that n auxiliary wirings with then-phase transfer voltages being respectively applied thereto are formed as one set makes it possible to provide the arrangement of wiring pattern for efficiently applying/supplying transfer voltages. In other words the number of the auxiliary wirings $10_1$–$10_3$, $20_1$–$20_3$, $30_1$–$30_3$ is set at "n" for permitting n-phase charge transfer voltages to be applied to such n auxiliary wirings.

As has been explained in detail above, the semiconductor energy detector incorporating the principles of the present invention obtain several effects and advantages which follow. Specifically, designing the wirings made of metals or else for cooperative assistance in transmission of transfer voltages at the transfer electrodes into a pattern of wiring shaving auxiliary wirings for performing application/supplement of transfer voltages and additional wirings for performing supplement of transfer voltages makes it possible to realize the intended wiring arrangement that may achieve both those wirings having a variety of different shapes and configurations such as a wiring pattern as formed with a wiring width greater than the pixel width and/or a wiring pattern formed of a single layer metal or the like—and application/supplement of transfer voltages to all the transfer electrodes involved.

Such the wiring arrangement is extremely effective in CCDs of the back-illuminated type with no limitations due to aperture ratios on the front side, which in turn permits achievement of a semiconductor energy detector capable of performing a read operation at high speeds while at the same time having high sensitivity even with respect to electron rays, X-rays, ultraviolet rays and others. Furthermore, it becomes possible to attain miniaturization or downsizing of pixels and also chip area enlargement while retaining this high-speed readout.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor energy detector having on a surface side of a CCD a group of transfer electrodes with a charge transfer voltage being applied thereto, comprising auxiliary wirings for connection of some of said electrodes, wherein at least one of said electrodes with said auxiliary wirings directly connected thereto and more than one of said electrodes with none of said auxiliary wirings being directly connected thereto are connected via an additional wiring, wherein said semiconductor energy detector is a back-illuminated type, and each of said auxiliary wirings and each of said additional wirings respectively have a width greater than a per-pixel length of a two-dimensional pixel array in said CCD.

2. The semiconductor energy detector as recited in claim 1, characterized in that at least one of said auxiliary wirings and said additional wirings is made of either a metal or metal suicide.

3. The semiconductor energy detector as recited in claim 1, characterized in that respective ones of said auxiliary wirings and said additional wirings are formed of metals or metal silicides of a same kind in a direction along the thickness thereof.

4. The semiconductor energy detector as recited in claim 1, characterized in that each auxiliary wiring comprises a continuum of a vertical auxiliary wiring portion vertically extending with respect to said electrodes and a horizontal auxiliary wiring portion extending in parallel to said electrodes.

5. The semiconductor energy detector as recited in claim 1, characterized in that each said additional wiring comprises a vertical additive wiring portion in parallel to a vertical auxiliary wiring portion.

6. The semiconductor energy detector as recited in claim 1, characterized in that a number of said auxiliary wirings is n, and that charge transfer voltages of n phases are applied to said n auxiliary wirings.

7. A semiconductor energy detector having on a surface side of a CCD a group of transfer electrodes with a charge transfer voltage being applied thereto, comprising auxiliary wirings for connection of some of said electrodes, wherein at least one of said electrodes with said auxiliary wirings directly connected thereto and more than one of said electrodes with none of said auxiliary wirings being directly connected thereto are connected via an additional wiring, wherein respective ones of said auxiliary wirings and said additional wirings are formed of metals or metal silicides of a same kind in a direction along the thickness thereof, and each of said auxiliary wirings and each of said additional wirings respectively have a width greater than a per-pixel length of a two-dimensional pixel array in said CCD.

* * * * *